United States Patent [19]

Przybyszewski

[11] Patent Number: 4,851,300

[45] Date of Patent: Jul. 25, 1989

[54] PRECOAT FOR IMPROVING PLATINUM THIN FILM ADHESION

[75] Inventor: John S. Przybyszewski, Avon, Conn.

[73] Assignee: United Technologies Corporation, Hartford, Conn.

[21] Appl. No.: 192,318

[22] Filed: May 9, 1988

[51] Int. Cl.$^4$ .............................................. B32B 15/00
[52] U.S. Cl. ................................... 428/623; 428/632; 428/636; 428/670; 428/678
[58] Field of Search ............... 428/616, 622, 623, 632, 428/636, 670, 678, 680, 681

[56] References Cited

U.S. PATENT DOCUMENTS

| | | | |
|---|---|---|---|
| 3,890,456 | 6/1975 | Dils | 428/216 |
| 3,928,026 | 12/1975 | Hecht et al. | 428/615 |
| 4,123,595 | 10/1978 | Chang | 428/667 |
| 4,321,311 | 3/1982 | Strangman | 428/678 |
| 4,399,199 | 8/1983 | McGill et al. | 428/633 |
| 4,402,447 | 9/1983 | Przybyszewski et al. | 228/103 |
| 4,477,538 | 10/1984 | Clarke | 428/656 |
| 4,569,889 | 2/1986 | Przybyszewski et al. | 428/612 |

*Primary Examiner*—Upendra Roy
*Assistant Examiner*—George Wyszomierski
*Attorney, Agent, or Firm*—James M. Rashid

[57] ABSTRACT

A thin film noble metal temperature sensor includes adjacent layers of metals and metal oxides on the surface of a component. The most preferred sequence of layers are: a NiCoCrAlY layer applied directly to the component surface; a thermally grown aluminum oxide layer on the NiCoCrAly layer; a sputtered layer of aluminum oxide on the thermally grown layer of aluminum oxide; a FeCrAl layer on the sputtered aluminum oxide layer; and layer of platinum and platinum-rhodium on the FeCrAl layer.

9 Claims, 1 Drawing Sheet

PRECOAT FOR IMPROVING PLATINUM THIN FILM ADHESION

TECHNICAL FIELD

This invention relates to thin film sensors, and in particular, to a method for improving the adhesion of platinum rich alloy thin films to non-metallic surfaces.

BACKGROUND

The development and testing of advanced gas turbine engines requires the availability of sensors capable of accurately measuring temperatures in the range of about 980° C. (about 1,800° F.) and higher. Such sensors must be able to withstand rapid temperature cycling and complex gas flows. They must also be compatible with the component to which they are attached and must conform to the component surface without significantly disturbing air flow patterns over the component.

In commonly assigned U.S. Pat. No. 3,890,456 to Dils, a method for forming such a sensor on a superalloy gas turbine engine component is disclosed. As shown in FIG. 1, the Dils sensor 10 comprises several layers of different materials applied to the surface 12 of a component 13 which is to be tested. The first layer 14 has an MCrAlY composition, where M is iron, cobalt, or nickel. A thermally grown layer 16 of aluminum oxide, formed by oxidizing the MCrAlY layer 14 lies over the MCrAlY layer 14 and acts as an electrical insulator. Separate noble metal layers 20, 22 such as platinum and a platinum-10% rhodium alloy respectively, lie over the thermally grown aluminum oxide layer 16 and are applied in such a manner that they form a junction 17. Lead wires are attached to each noble metal layer 20, 22 by, e.g., tack welding. The lead wires are then connected to a read-out device in conventional fashion.

One problem which limits the usefulness of sensors 10 applied by Dils is that the noble metal layers 20, 22 spall or become delaminated from the aluminum oxide layer. Attempts to improve the bond strength between the noble metal layers 20, 22 and the aluminum oxide layer 16 have not been entirely satisfactory; for example, grit blasting the aluminum oxide layer 16 prior to application of the noble metal layers 20, 22 has had limited success, and is even undesired since the rough surface of the aluminum oxide 16 sometimes results in poor electrical properties. Furthermore, the Dils' sensor 10 is particularly prone to failure if the noble metal layers 20, 22 are applied in a high humidity environment.

Consequently, what is needed is a thin film sensor with improved properties, particularly with improved strength between the noble metal layers and the insulating layer.

SUMMARY OF THE INVENTION

According to this invention, a thin film sensor which comprises an MCrAlY-type layer applied to the component surface, an insulating layer applied to the MCrAlY-type layer, and noble metal layers applied to the insulating layer, further comprises an MCrAl-type layer between the noble metal layer and the insulating layer. The bond between the MCrAl-type layer and the noble metal layers has significantly improved strength compared to the bond between the noble metal layer and the insulating layer of the prior art sensors, and provides a sensor with better durability in severe operating environments than prior art sensors.

The term "MCrAl-type layers" is meant to describe layers containing chromium, aluminum and either nickel, cobalt, iron, or mixtures thereof; they can also contain elements such as yttrium, rare earth elements, or noble metals. The preferred MCrAl-type composition in this invention is a FeCrAl, containing about 78% iron, 12% aluminum, and 10% chromium. It is applied to a thickness of between about 0.02–0.05 microns (about 0.0006–0.002 mils). The thin FeCrAl layer is essentially nonconductive, and has little or no effect on the properties of the noble metal layers other than to improve their bond strength to the insulating layer.

BEST MODE FOR CARRYING OUT THE INVENTION

This invention is particularly suited for fabricating thin film temperature sensors on the surface of superalloy components used in gas turbine engines. However, those skilled in the art will recognize that the invention is useful with other types of components which require testing at high temperatures. Typical of the type of superalloys used in the gas turbine engine industry are the directionally solidified alloys described in commonly assigned U.S. Pat. No. 4,209,348 to Duhl et al.

Figure 2:
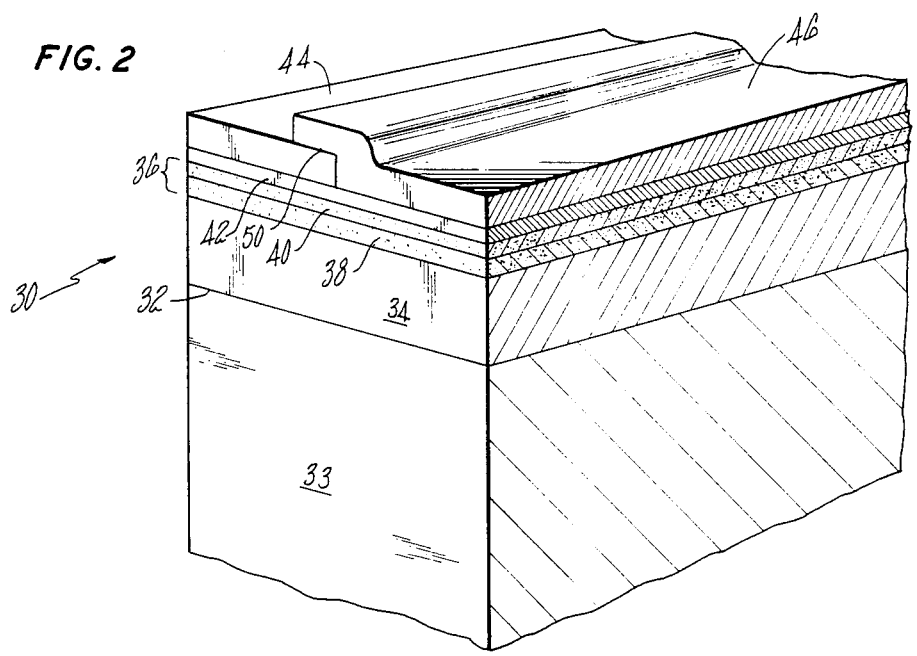
FIG. 2 is a cross sectional view, partly in perspective, of a thin film thermocouple fabricated according to this invention.

Referring to FIG. 2, the sensor of this invention is indicated by the general reference numeral 30. The sensor 30 comprises several adjacent layers of material deposited onto the superalloy surface 32. The layer 34 which is applied directly to the surface 32 of the superalloy 33 has an MCrAlY-type composition, and is applied by physical vapor deposition techniques. Sputtering is the preferred technique, and is used to apply a layer 34 which is in the range of about 12.5–125 microns (about 0.5–5 mils) thick. Examples of MCrAlY-type compositions which can be used as the layer 34 are the NiCrAlY, CoCrAlY, and FeCrAlY materials disclosed in the aforementioned patent to Dils, which is incorporated by reference. Other MCrAlY-type compositions which can be used to form the layer 34 are described in, for example, commonly assigned U.S. Pat. Nos. 3,928,026 to Hecht et al (NiCoCrAlY) and Re. 32,121 to Gupta et al (NiCoCrAlY+Hf+Si), also incorporated by reference. The most preferred MCrAlY composition falls within the range which consists essentially of, by weight percent, 14–22Cr, 20–26Co, 11.5–13.5Al, 0.1–0.5Y, balance nickel.

Upon the surface of the MCrAlY-type layer 34 is an insulating material 36. The preferred insulator is aluminum oxide, since it provides the best insulating characteristics at elevated temperatures. Several techniques exist for applying the insulating material 36. The preferred method is to apply the insulator in two steps; in the first step, the MCrAlY coated component is heated to a high temperature in an oxygen containing atmosphere, to cause oxidation of the MCrAlY layer 34. The alumina scale which forms is termed a thermally grown scale, and is indicated by the reference numeral 38 in FIG. 2. While not shown in the Figure, the thermally grown scale 38 has a tendency towards being nonuniform in thickness, and can contain oxides based upon elements other than aluminum; for example, oxides of nickel and chromium have been observed to form when a NiCrAlY composition is oxidized. However, in view of the desirable thermal expansion characteristics of a thermally grown scale, it is preferred. The insulating characteristics of alumina are best when its surface is smooth; to obtain a smooth alumina surface, the layer 40 should be polished to less than 15 microinches AA, preferably about 5 microinches AA by techniques such as those described in U.S. Pat. No. 4,569,889 to Przybyszewski et al, which is incorporated by reference. Then, since the thermally grown alumina layer 40 sometimes has defects of one sort or another which affect the layer's insulating characteristics, a layer of alumina 40 is sputtered over the thermally grown alumina 38. The total average thickness of the insulating alumina layer 36 should be in the range of about 75–100 microns (about 3–4 mils). If the preferred thermally grown and sputtered alumina scale combination is used, the thickness of the sputtered layer 40 should be about 2–10 microns (about 0.08–0.40 mils) thick.

Figure 1:
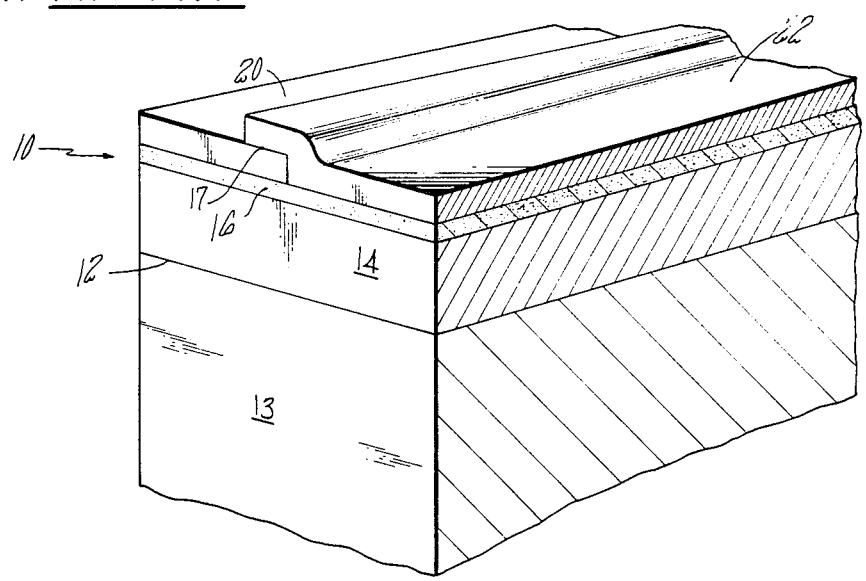
FIG. 1 is a cross sectional view, partly in perspective, of a thin film thermocouple fabricated using the techniques of the prior art.

Applied to the surface of the insulating layer 36 is an MCrAl-type layer 42. As noted above, the composition of this layer 42 can be NiCrAl, CoCrAl, FeCrAl, or combinations thereof. It can also include additions of yttrium or rare earth elements as well as noble metals. A FeCrAl composition is preferred. The bond between the subsequently applied noble metal layers 44, 46 and the FeCrAl layer 42 in sensors made according to this invention have greater strength as compared to the bond in prior art sensors, i.e., the bond between the noble metal layers 20, 22 and the alumina layer 16 (FIG. 1). When the composition of the layer 42 is MCrAl, the chromium and aluminum should each be present in levels of about 8–13 weight percent. The most preferred MCrAl composition is approximately 78Fe - 12Al - 10Cr. Sputtering is the preferred technique for applying the MCrAl-type layer 42, and the FeCrAl layer 42 should be applied to a thickness within the range of about 0.015–0.05 microns (about 0.0006–0.002 mils). Layers thicker than about 0.05 microns should be avoided, since at such thicknesses the FeCrAl tends to become conductive and could short out the sensor 30 during use.

Noble metal layers 44, 46 are applied onto the surface of the MCrAl-type layer 42. In the fabrication of temperature sensors for use above about 980° C., the noble metal layers 44, 46 are platinum and platinum-10% rhodium; FIG. 2 shows that the platinum and platinum-rhodium layers 44, 46 respectively are applied so as to meet at a junction 50. Appropriate masking techniques are utilized to form such junction 50, in a manner which is conventional in the sputtering arts. The thickness of each noble metal layer should be in the range of about 2.5–5 microns (0.1–0.2 mils). Such a thickness is sufficient to provide the necessary sensor capabilities, yet thin enough to promote additional growth of the thermally grown alumina scale, during a subsequent oxidation operation, if additional scale thickness is needed.

The final step in the sensor fabrication process is to attach lead wires to the surface of the noble metal layers 44, 46. It is preferred that the thickness of the noble metal layers 44, 46 be increased in the area at which the lead wires are to be attached, and such can readily be accomplished during the sputtering process which deposits the layers 44, 46. The thickness in the attachment area should be about 5–13 microns (about 0.2–0.5 mils) with lead wires having a diameter of about 0.08 microns (about 0.003 mils). The composition of the lead wires should correspond to the composition of the noble metal films; i.e., platinum lead wires should be attached to the platinum layer and platinum-rhodium lead wires should be attached to the platinum-rhodium layer.

Although this invention has been shown and described with respect to a preferred embodiment, it will be understood by those skilled in the art that various changes in form and detail thereof may be made without departing from the spirit and scope of the claimed invention.

I claim:

1. A temperature sensor adhered to a metal component, comprising:
    (a) a first metal layer adhered to the surface of the metal component, wherein said metal layer comprises chromium, aluminum, yttrium, and at least one element selected from the group consisting of nickel, cobalt, iron, or mixture thereof;
    (b) an insulating metal oxide layer adhered to the first metal layer;
    (c) a second metal layer adhered to the metal oxide layer, wherein said second metal layer comprises chromium. aluminum, and at least one element selected from the group consisting of nickel, cobalt, iron, or mixtures thereof;
    (d) a noble metal layer adhered to the second metal layer; and
    (e) a lead wire adhered to the noble metal layer.

2. The sensor of claim 1, wherein the first metal layer in NiCrAlY, CoCrAlY, FeCrAlY, or mixtures thereof.

3. The sensor of claim 2, wherein the metal oxide layer is substantially aluminum oxide.

4. The sensor of claim 3, wherein the metal oxide layer includes a first layer of thermally grown aluminum oxide and a second layer of physical vapor deposited aluminum oxide.

5. The sensor of claim 2, wherein the second metal layer is NiCrAl, CoCrAl, FeCrAl, or mixtures thereof.

6. The sensor of claim 5, wherein the second metal layer is FeCrAl.

7. The sensor of claim 2, wherein the noble metal layer includes a layer of platinum and a layer of a platinum-10 rhodium alloy adjacent to each other on the second metal layer.

8. The sensor of claim 7, including a platinum lead wire adhered to the platinum layer and a platinum-10% rhodium lead wire adhered to the platinum-10% rhodium layer.

9. A temperature sensor adhered to a metal superalloy component, comprising:
    (a) an NiCoCrAlY layer adhered to the surface of the metal component, consisting essentially of, by weight percent, about 14–22 Cr, 20–26 Co, 11.5–13.5 Al, 0.1–0.3 Y, balance Ni;
    (b) a thermally grown aluminum oxide layer on the NiCoCrAly layer;
    (c) a physical vapor deposited aluminum oxide layer on the thermally grown aluminum oxide layer;
    (d) a FeCrAl layer on the physical vapor deposited aluminum oxide layer consisting essentially of, by weight percent, 70–85 Fe, 3.5–16 Al, 3.5–16 Cr; and
    (e) layers of platinum and platinum-10 rhodium, each on the FeCrAl layer, and which contact each other at a junction.

* * * * *